United States Patent [19]
Jeong et al.

[11] Patent Number: 5,968,850
[45] Date of Patent: Oct. 19, 1999

[54] WIRING USING CHROMIUM NITRIDE AND METHODS OF FABRICATION THEREFOR, LIQUID CRYSTAL DISPLAY PANELS USING THE SAME WIRING AND METHODS OF FABRICATION THEREFOR

[75] Inventors: Jong-In Jeong, Suwon-si; Cheol-Su Jeong, Yongin-si; Dae-Won Park, Yongin-si; Chul-Yong Lee, Yongin-si; Chul-Ho Kwon, Seoul, all of Rep. of Korea

[73] Assignee: Samsung Electronics, Co., Ltd., Suwon, Rep. of Korea

[21] Appl. No.: 08/947,864

[22] Filed: Oct. 9, 1997

[30] Foreign Application Priority Data

Oct. 11, 1996 [KR] Rep. of Korea ...................... 96-45473
Jun. 16, 1997 [KR] Rep. of Korea ...................... 97-24847

[51] Int. Cl.$^6$ ................................. H01L 21/00; B44C 1/22
[52] U.S. Cl. ............................ 438/754; 216/23; 216/102; 347/147; 438/609; 438/673; 438/713; 438/719
[58] Field of Search ...................................... 438/713, 724, 438/744, 720, 738, 742, 754, 30, 609, 138, 673; 216/2, 23, 75, 31, 102; 349/42, 43, 139, 143, 146, 147

[56] References Cited

U.S. PATENT DOCUMENTS

| 4,970,368 | 11/1990 | Yamazaki et al. | 216/23 X |
| 5,234,541 | 8/1993 | Shannon | 216/23 X |
| 5,792,705 | 8/1998 | Wang et al. | 438/723 X |

*Primary Examiner*—William Powell
*Attorney, Agent, or Firm*—Marger Johnson & McCollom, P.C.

[57] ABSTRACT

A wiring according to the present invention is made of a chromium layer and a chromium nitride layer. To make the wiring, a layer of chromium is deposited on a substrate, and then a layer of chromium nitride is deposited. A layer of photoresist is covered on the layer of chromium nitride and patterned, the layers of chromium and chromium nitride are wet etched in sequence using the photoresist pattern as a mask. Since the layer of chromium nitride is etched more quickly than the layer of chromium, the layer of photoresist and the layer of chromium are separated from each other and the chromium layer is isotropically etched to form a pattern having an edge with a gentle slope.

32 Claims, 5 Drawing Sheets

WIRING USING CHROMIUM NITRIDE AND METHODS OF FABRICATION THEREFOR, LIQUID CRYSTAL DISPLAY PANELS USING THE SAME WIRING AND METHODS OF FABRICATION THEREFOR

BACKGROUND OF THE INVENTION (a) Field of the Invention

The present invention relates to wiring using chromium nitride, methods of fabrication therefor, liquid crystal display panels using the same wiring and methods of fabrication therefor.

(b) Description of the Related Art

Aluminum or chromium is used for wiring of liquid crystal display (LCD) panels, i.e. gate lines or data lines. Chromium is widely used for data lines because of the better ohmic contact with amorphous silicon and indium tin oxide than aluminum though it has relatively high resistance.

An example of the conventional LCD panel and the manufacturing method is described in U.S. application Ser. No. 08/754644.

Aluminum or aluminum alloy is used to make gate lines, but aluminum or its alloy reacts with the ITO (indium tin oxide) layer. So, gate lines are made of a double layer of aluminum and chromium instead of a single layer of aluminum, and the upper layer of aluminum is removed in the gate pad region. But, the additional step of removing the layer of aluminum complicates the process. Moreover, the surface of the chromium layer is contaminated when dry etching, and the surface of the chromium tends to impair the steps of forming the passivation layer and forming the contact holes.

SUMMARY OF THE INVENTION

It is therefore an object of the present invention to decrease the degradation of a display by forming a chromium layer having a sloped edge.

It is another object of the present invention to make the contact resistance between the transparent electrode and the chromium layer low by decreasing the contamination and damage of the chromium layer.

It is another object of the present invention to make the process simple.

A wiring according to the present invention is made of a double layer comprising a conductive layer and a layer of chromium nitride.

The conductive layer may comprise chromium, then wiring having a gentle sloped edge is given. The wiring may be used as gate lines or data lines in a liquid crystal display panel.

Moreover, because the etching rate of the chromium nitride layer increases as the ratio of nitrogen in the chromium nitride increases, it is possible to increase the ratio of nitrogen in the chromium nitride from the bottom portion of the layer to the upper portion of that. For example, the layer of chromium nitride is made of a double layer consisting of a layer having low ratio of nitrogen and the other layer having high ratio of nitrogen.

The conductive layer can be made of aluminum or an aluminum alloy, and this conductive layer is used as a gate line in liquid crystal display panels. In this case, the step of removing the aluminum layer in the gate pad region may be omitted, so the process becomes simple.

To make the wiring made of a chromium layer and a chromium nitride layer, a chromium layer and a chromium nitride layer are deposited successively and a layer of photoresist is formed and patterned. The layer of chromium and the layer of chromium nitride are wet etched using a patterned layer of photoresist as a mask.

While the layer of chromium is very adhesive to the layer of photoresist, chromium nitride is not, so the layer of chromium nitride is able to be etched under the photoresist pattern. Thereafter, the chromium layer is isotropically etched to form a wiring having an edge with a gentle slope.

The layer of chromium and the layer of chromium nitride are deposited preferably by reactive sputtering. When the layer of chromuim is deposited, only argon gas is used, and when the layer of chromium nitride is deposited, a mixture of argon gas and nitrogen gas is used. The flux of argon gas is 50 sccm–200 sccm when the layer of chromium is deposited and the flux of argon gas is 0 sccm–200 sccm and the flux of nitrogen is 50 sccm–300 sccm when the layer of chromium nitride is deposited. The flux of nitrogen, when the layer of chromium nitride is deposited, may be increased gradually in time.

The double layer of a conductive layer and a layer of chromium nitride is applicable to an LCD. For example, in the case of processing the gate lines of the LCD, the process becomes simple because the upper part of the gate pad is a layer of chromium nitride, and there is no need to etch. Moreover, if it is applied to data pattern, electronic contact between the data pattern and the transparent electrode becomes better because the layer of chromium nitride does not react with the gas used in the step of dry etching.

According to the present invention, a contact structure between a conductive layer and a transparent conductive layer has a buffer layer made of chromium nitride to improve the ohmic contact between the conductive layer and the transparent conductive layer.

The contact structure having a chromium nitride buffer is also applicable to an LCD. For example, if the buffer layer made of chromium nitride is formed between the drain electrode and the pixel electrode, between the gate pad and the transparent electrode for the gate pad and between the data pad and the transparent electrode for the data pad, the contact resistance become low, and therefore the display characteristics are improved.

DETAILED DESCRIPTION OF THE PREFERRED EMBODIMENTS

Figure 1A:
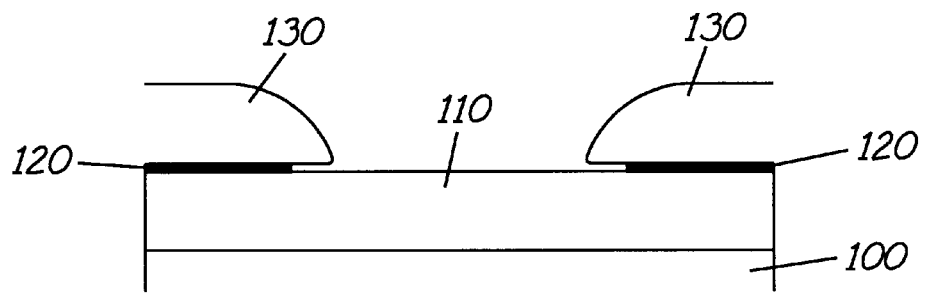
FIG. 1A and FIG. 1B show cross-sectional views of the intermediate structures in the step of etching a double layer of chromium/chromium nitride according to an embodiment of the present invention.

The present invention will now be described more fully hereinafter with reference to the accompanying drawings, in which the preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

First, characteristics of a single layer of chromium, a double layer of chromium/chromium nitride, and a single layer of chromium nitride are compared. All the layers are formed by reactive sputtering using a chromium target, and the chromium layer or the chromium nitride layer is deposited by controlling the flux of argon gas and nitrogen gas. That is, the chromium layer is formed by flowing only argon gas, and the chromium nitride layer is formed by flowing a proper mixture of argon gas and nitrogen gas.

In the above-mentioned three cases, the fluxes of argon and nitrogen gas are shown in Table 1. The unit of the flux is sccm.

TABLE 1

|  | Cr/CrNx | | |
| --- | --- | --- | --- |
| Cr | Cr | CrNx | CrNx |
| Ar/N$_2$ | Ar/N$_2$ | Ar/N$_2$ | Ar/N$_2$ |
| 50/0 | 50/0 | 50/150 | 50/150 |
|  | 50/0 | 140/150 | 140/150 |

For the layers formed by the above-mentioned method, resistivity, surface reflectivity and thickness are measured, and they are shown in Table 2.

TABLE 2

|  | Ar/N$_2$ (sccm) | resistivity (Ω/□) | surface reflectivity (%) | thickness (Å) |
| --- | --- | --- | --- | --- |
| Cr | 50/0 | 1.32 | 170 | 1,500 |
| Cr/CrNx | 50/150 | 1.37 | 142 | 1,713 |
|  | 140/150 | 1.39 | 134 | 1,717 |
| CrNx | 50/150 | 1,275 | 71.5 | 753 |
|  | 140/150 | 2,004 | 74.4 | 933 |

In Table 2, the flux of argon gas and nitrogen gas when the double layer of Cr/CrNx is formed is measured in the step of forming the CrNx layer.

As shown in Table 2, the resistivity of a single layer of chromium nitride is very large, and the resistivity decreases as the ratio of nitrogen in the gas increases. The surface reflectivity of a single layer of chromium nitride is much smaller than that of a single layer of chromium. On the other hand, the resistivity of the double layer of chromium/chromium nitride is larger by 0.05–0.07 Ω/□ than the single layer of chromium and the surface reflectivity of the double layer is smaller than the single layer of chromium.

To test the etching characteristics of the three layers, a layer of photoresist is patterned on each of the three layers and the photoresist was hard baked at 130° C. for 30 minutes, then wet etched using (NH$_4$)$_2$Ce(NO$_3$)$_6$. The etching rates of the layer of chromium and the layer of chromium nitride were measured during the etching process. Afterwards, the slopes of the layer of chromium and the double layer of Cr/CrNx were observed by using a SEM. The results are shown in Table 3.

TABLE 3

|  | Ar/N$_2$ (sccm) | etching rate (Å/min) | slope (°) |
| --- | --- | --- | --- |
| Cr | 50/0 | 740 | 90 |
| Cr/CrNx | 50/150 | — | 35–45 |
|  | 140/150 | — | 50–60 |
| CrNx | 50/150 | 5,500 | — |
|  | 140/150 | 3,609 | — |

In Table 3, the flux of argon gas and nitrogen gas, when a double layer of Cr/CrNx is formed, is measured in the step of forming a layer of CrNx.

Figure 1B:
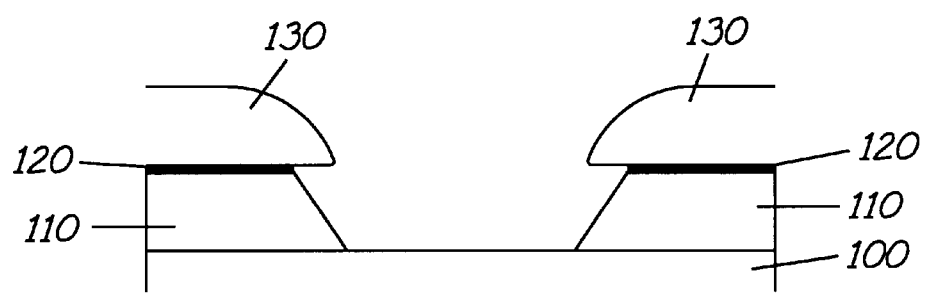

As shown in Table 3, in the case of the double layer of chromium/chromium nitride, the slope is very gentle in the range of 35°–60°, the etching rate of the layer of chromium nitride is 5–7 times larger than that of the layer of chromium. In view of the above result, if the double layer of Cr/CrNx covered with a layer of photoresist is in contact with the etchant, the chromium nitride layer 120 of 100–300 Å thickness which is located between the chromium layer 110 and the layer 130 of photoresist is etched first to separate the chromium layer 110 of 1,500–3,000 Å thickness and the layer 130 of photoresist, as shown in FIG. 1A. Then, the layer of chromium 110 is isotropically etched to form a pattern having an edge with a gentle slope, as shown in FIG. 1B.

Figure 2:
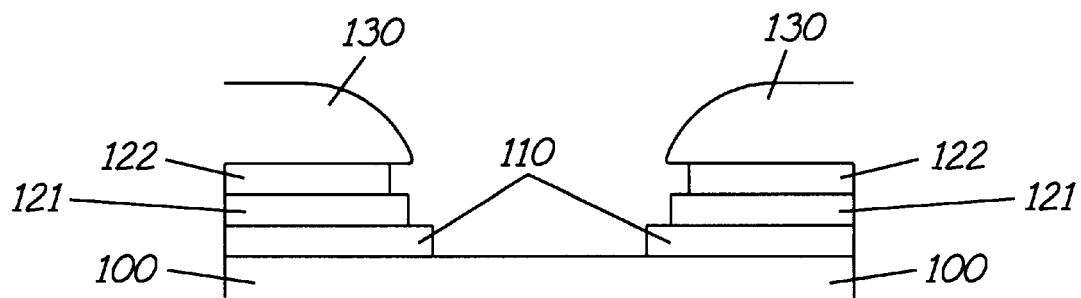
FIG. 2 illustrates a cross-sectional view showing the etching slope of a complex layer of chromium/chromium nitride/chromium nitride according to the embodiment of the present invention.

Moreover, as shown in Table 3, the etching rate of the layer of the chromium nitride increases as the ratio of the nitrogen in the gas increases. According to the above-mentioned condition, it is possible to make a gentle slope by increasing the flux of nitrogen gas or decreasing the flux of argon gas in time. That is, a first layer 121 of chromium nitride is formed on the layer 110 of chromium, and a second layer 122 of chromium nitride is formed on the first layer 121 of chromium nitride by flowing more nitrogen gas than when the first layer 121 of chromium nitride is formed, then the layers are etched to make a stepped slope as shown in FIG. 2.

Now, a substrate of liquid crystal display using a double layer of Cr/CrNx as wiring will be described more fully hereinafter with reference to the accompanying drawings.

First, the structure of the TFT substrate will be described with reference to FIG. 3 and FIG. 4. FIG. 4 illustrates a cross-sectional view of the TFT substrate shown in FIG. 3 along the line IV–IV'.

A gate pattern including a gate line 200, a gate electrode 210 which is a branch of the gate line 200, and a gate pad 220 formed at the end of the gate line 200 is formed on a substrate 100. The gate electrode 210 and the gate pad 220 respectively include a lower layer 211 and 221 made of aluminum alloy and an upper layer 212 and 222 made of chromium nitride, and the gate line 200 consists of the double layer of aluminum alloy and chromium nitride though it is not shown in the figures. The gate pad 220 transfers the scanning signal to the gate line 200 from the outside.

A gate insulating layer 300 of silicon nitride is formed on the gate pattern 200, 210, 220, and the gate insulating layer 300 has a contact hole 720 exposing the upper layer 222 of chromium nitride of the gate pad 220. A layer 400 of a-Si which is an active layer of TFT is formed on the gate insulating layer 300 directly above the gate electrode 210, and a layer 510, 520 of N+ a-Si thereon is formed on left and right sides of the gate electrode 210 respectively as an ohmic contact layer.

A data line 600 is formed on the gate insulating layer 300 and perpendicular to the length of the gate line 200, and at the end of the data line 600, a data pad 630 which transfers the image signal from the outside is formed. A source electorde 610 which is a branch of the data line 600 is formed on the layer 510 of N+ a-Si, a drain electrode 620 is formed on the layer 520 of N+ a-Si.

A gate pad connecting member 640 is formed on the gate insulating layer 300 near the gate pad 220. The data pattern includes the data line 600, the source/drain electrodes 610, 620, the data pad 630, and the gate pad connecting member 640 respectively consisting of the lower layers 611, 621, 631, 641 of chromium and the upper layers 612, 622, 632, 642 of chromium nitride.

A passivation layer 700 is formed on the above mentioned data pattern and the layer 400 of a-Si which is not hidden with the data pattern, and contact holes 720, 710, 730, 740 are formed to expose the upper layer 222, 622, 632, 642 of the chromium nitride of the gate pad 220, the drain electrode 620, the data pad 630 and the gate pad connecting region 640, respectively.

Then, a pixel electrode 800 which is made of ITO(indium tin oxide) and connected to the drain electrode 620 through the contact hole 710 on the passivation layer 700 is formed. An ITO electrode 810 for the gate pad which is connected to the exposed gate pad 220 and the gate pad connecting region 640 and transfer the signal from the outside to the gate line 200 and an ITO electrode 820 for the data pad which is connected to the data pad 630 and transfer the signal form the outside to the data line 600.

Figure 3:
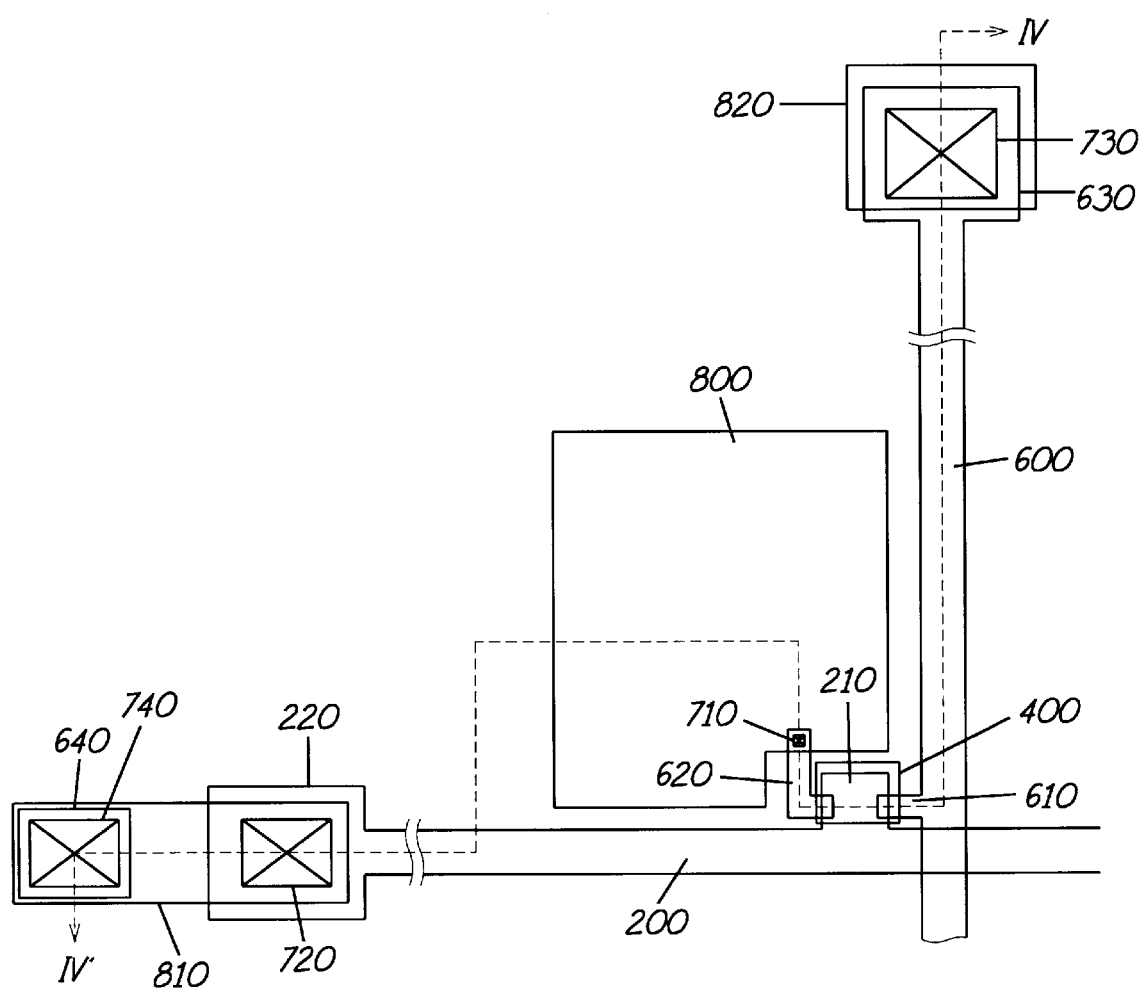
FIG. 3 illustrates a layout showing the manufacturing process of the TFT substrate according to the embodiment of the present invention.
Figure 4:
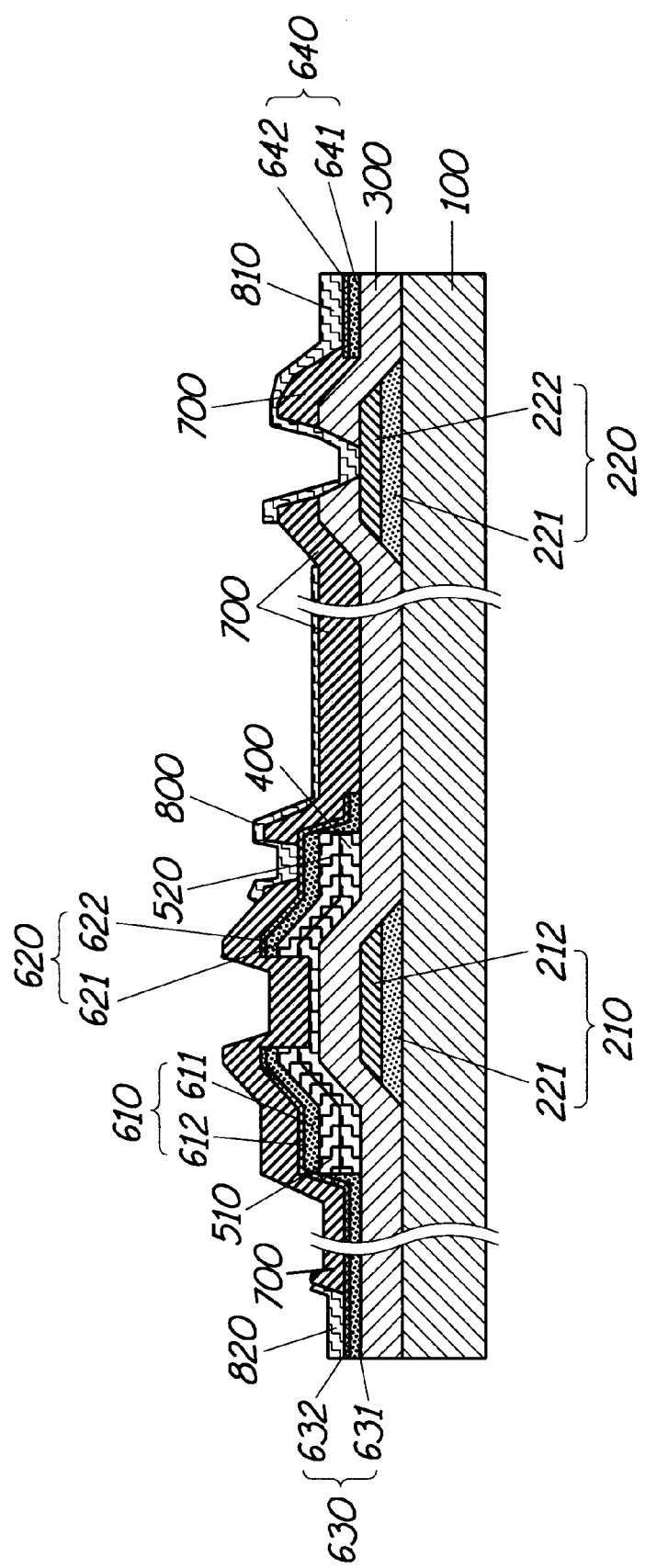
FIG. 4 illustrates a cross-sectional view of the TFT substrate shown in FIG. 3 along the line IV–IV'.

Now, a method of fabricating the TFT substrate which is illustrated in FIGS. 3-4 will be described with reference to FIGS. 5A–5D. The method of fabrication according to the embodiment of the present invention uses 5 masks.

Figure 5A:
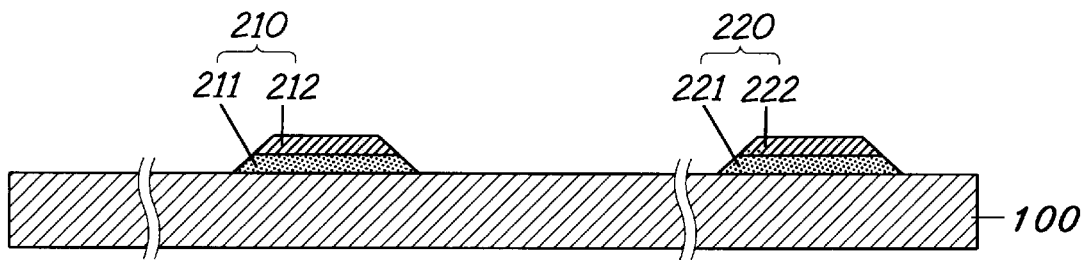
FIG. 5A–5D illustrate cross-sectional views of intermediate structures illustrating a method of manufacturing the TFT substrate shown in FIG. 4.

As shown in FIG. 5A, a layer of aluminum alloy of aluminum and neodimium (Nd) and a layer of chromium nitride are deposited successively on a transparent insulating substrate 100, and photo etched using a first mask to form a gate pattern which is made of a double layer and includes a gate line 200, a gate electrode 210 and a gate pad 220. That is, as shown in FIG. 5A, the gate electrode 210 consists of a lower layer 211 of aluminum alloy and an upper layer 212 of chromium nitride, the gate pad 220 consists of a lower layer 221 of aluminum alloy and an upper layer 222 of chromium nitride, though not shown in FIG. 5A, the gate line 210 has a double layer, too.

Figure 5B:
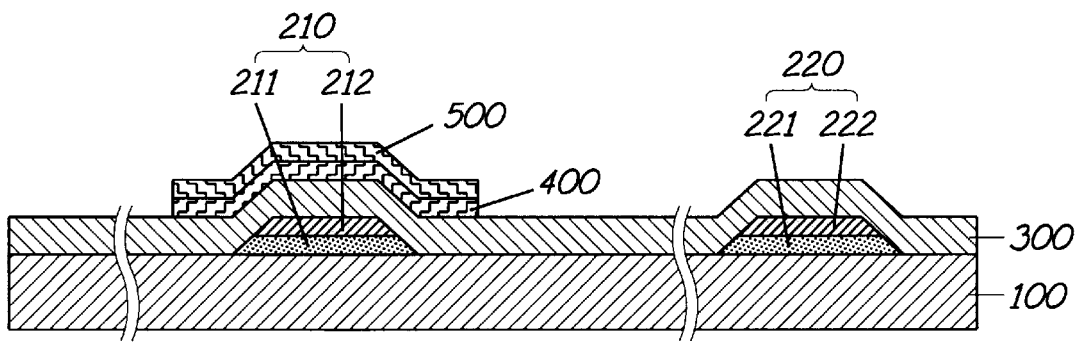

As shown in FIG. 5B, a gate insulating layer 300 made of silicon nitride, a layer 400 of a-Si and a layer 500 of N+ a-Si are deposited sequentially, the layer 500 of N+ a-Si and the layer 400 of a-Si are photo etched using a second mask.

Figure 5C:
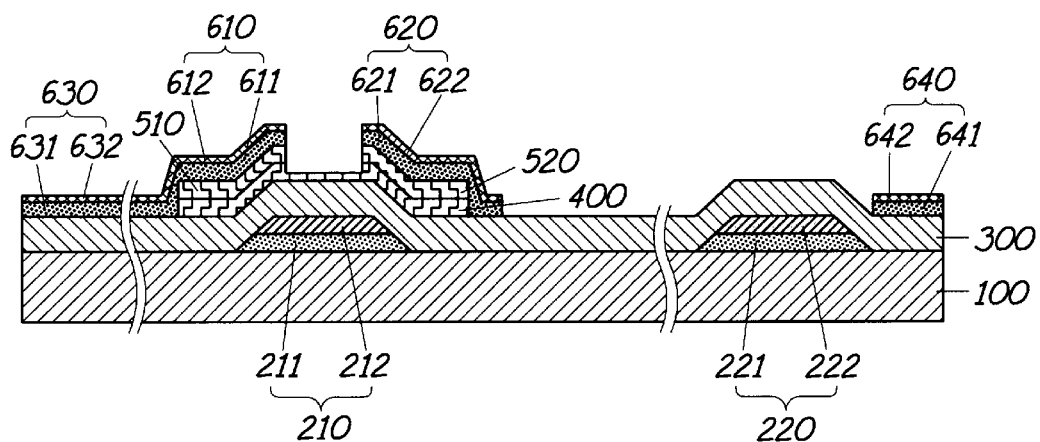

As shown in FIG. 5C, a layer of chromium and a layer of chromium nitride are deposited successively, and the layers are wet etched using a third mask to form a data pattern which is made of a double layer and includes a data line 600, a source electrode 610, a drain electrode 620, a data pad 630 and a gate pad connecting region 640. Then, using the data pattern 600, 610, 620, 630, 640 as a mask, the exposed layer 500 of N+ a-Si is dry etched to separate into two parts using gate electrode 210 as a center, and to expose the layer 400 of a-Si between the two separated layers 510, 520 of N+ a-Si.

Figure 5D:
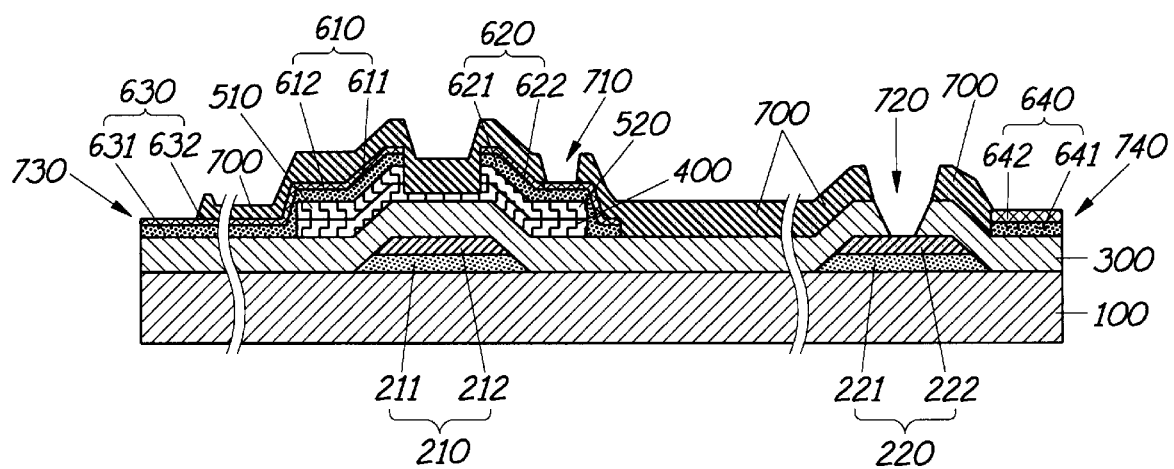

As shown in FIG. 5D, a passivation layer 700 is formed and photo etched with the insulating layer 300 using a fourth mask to form contact holes 710, 720, 730, 740 which expose the upper layer of chromium nitride 622, 222, 632, 642 of the drain electrode 620, the gate pad 220, the data pad 630 and the gate pad connecting region 640, respectively.

Last, as shown in FIG. 4, a layer of ITO is deposited and dry etched using a fifth mask to form an ITO pattern including a pixel electrode 800 and an ITO electrode 820 for the data pad which are connected to the drain electrode 620 and the data pad 630 through the contact holes 710, 730 respectively, and an ITO electrode 810 for the gate pad which is connected to the gate pad 220 and the gate pad connecting region 640 through the contact holes 720, 740 respectively.

The ITO pattern is connected to the upper layer of chromium nitride 622, 222, 632, 642 of the drain electrode 620, the gate pad 220, the data pad 630 and the gate pad connecting region 640. Here, the chromium nitride layer make the contact resistance between the lower layer of chromium and the ITO layer low as a buffer layer.

The TFT substrate which is fabricated using the above-mentioned method is compared to the substrate which has a data pattern formed with a single layer of chromium. The results will be described below. The current-voltage characteristics are measured and the results did not show a drop. The contact resistance between the data pattern and the ITO electrode is decreased greatly from 1054.30 kÅ to 12.82 kÅ, but the line resistivity of the data pattern increased a little from 2.50 kÅ to 2.79 kÅ. The number of bad pixels strikingly decreased from 0–1 to 0 at a 106 sec etching time, 19–496 to 0 at a 146 sec etching time, 230–886 to 4–44 at a 226 sec etching time.

An LCD which includes the above-described TFT substrate is compared to the LCD which includes data pattern made of a single layer of chromium. The result was really good. The crosstalk decreased from 2.329% to 1.79%, and the contrast ratio increased from 198.2% to 219.3%.

As shown in the above, the data pattern which made of a double layer of chromium and chromium nitride has a gentle slope, so the number of bad pixels decreases. And the performance of the LCD becomes better because of the small contact resistance in the ITO electrodes. The surface reflectivity becomes smaller, and the crosstalk decreases, and the contrast ratio increases.

What is claimed is:

1. A wiring comprising:
   a conductive layer; and
   a first layer of chromium nitride which is formed on the conductive layer.

2. A wiring of claim 1, wherein the conductive layer is made of chromium.

3. A wiring of claim 2, wherein the ratio of nitrogen in the first layer of chromium nitride increasingly varies from the bottom to the top of the first layer of chromium nitride.

4. A wiring of claim 2, further comprising:
   a second layer of chromium nitride which is formed on the first layer of chromium nitride and which has more nitrogen than the first layer of chromium nitride.

5. A wiring of claim 1, wherein the conductive layer is made of aluminum or aluminum alloy.

6. A panel for a liquid crystal display (LCD), comprising:
   a first wiring including a first conductive layer and a first layer of chromium nitride formed on the first conductive layer.

7. A panel of claim 6, wherein the first conductive layer is made of chromium.

8. A panel of claim 7, wherein the first wiring is a data line.

9. A panel of claim 8, further comprising a second wiring including a second conductive layer made of aluminum of aluminum alloy and a second layer of chromium nitride formed on the second conductive layer.

10. A panel of claim 9, wherein the second wiring is a gate line.

11. A panel of claim 6, wherein the first conductive layer is made of aluminum or aluminum alloy.

12. A panel of claim 11, wherein the first wiring is a gate line.

13. A contact structure comprising:

a conductive layer;

a transparent conductive layer which is formed on the conductive layer; and a chromium nitride layer which is formed between the conductive layer and the transparent conductive layer and which is a buffer layer to improve the ohmic contact between the conductive layer and the transparent conductive layer.

14. A contact structure of claim 13, wherein the transparent conductive layer is made of ITO.

15. A panel for an LCD having a first transparent electrode which transfers the scanning signal from the outside, a gate pad which is connected to the first transparent electrode, a gate line which is connected to the gate pad, a gate electrode which is connected to the gate line, a second transparent electrode which transfers the display signal from the outside, a data pad which is connected to the second transparent electrode, a data line which is connected to the data pad, a source electrode which is connected to the data line, a drain electrode which transfers the display signal from the source electrode when the gate electrode is turned on and a pixel electrode which is connected to the drain electrode and displays the image, comprising:

a first chromium nitride layer which is formed between the drain electrode and the pixel electrode and which is a buffer layer to improve the ohmic contact between the drain electrode and the pixel electrode.

16. A panel of claim 15, more comprising:

a second chromium nitride layer which is formed between the gate pad and the first transparent electrode which is a buffer layer to improve the ohmic contact between the gate pad and the first transparent electrode.

17. A panel of claim 16, more comprising:

a third chromium nitride layer which is formed between the data pad and the second transparent electrode and which is a buffer layer to improve the ohmic contact between the data pad and the second transparent electrode.

18. A method of fabricating a wiring, comprising the steps of:

depositing a layer of chromium on a transparent insulating substrate;

depositing a layer of chromium nitride on the layer of chromium;

forming a layer of photoresist on the layer of chromium nitride;

patterning the layer of photoresist; and wet etching the layer of chromium nitride and the layer of chromium using the layer of photoresist as a mask.

19. A method of claim 18, wherein the layers of chromium and chromium nitride are deposited by a reactive sputtering method.

20. A method of claim 19, wherein argon gas is used when the layer of chromium is deposited.

21. A method of claim 20, wherein argon gas and nitrogen gas are used when the layer of chromium nitride is deposited.

22. A method of claim 21, wherein the flux of the argon gas is 50 sccm–200 sccm when the layer of chromium is deposited.

23. A method of claim 22, wherein the flux of the argon gas is 0 sccm–200 sccm and the flux of the nitrogen gas is 50 sccm–300 sccm when the layer of chromium nitride is deposited.

24. A method of claim 23, wherein the flux of the nitrogen gas is increased gradually in time when the layer of chromium nitride is deposited.

25. A method of claim 18, wherein an etchant used in the step of wet etching is $(NH_4)_2Ce(NO_3)_6$.

26. A method of fabricating a thin film transistor substrate for a liquid crystal display, comprising the steps of:

depositing a first conductive layer and a first layer of chromium nitride in sequence on a transparent insulating substrate;

forming a gate pattern which includes a gate line, a gate electrode and a gate pad by patterning the first conductive layer and the first layer of chromium nitride.

depositing a gate insulating layer and a semiconductor layer in sequence;

patterning the semiconductor layer;

depositing a second conductive layer and a second layer of chromium nitride in sequence;

forming a data pattern which includes a data line, a source electrode, a drain electrode and a data pad by patterning the second conductive layer and the second layer of chromium nitride;

depositing a passivation layer;

forming a plurality of contact holes exposing the drain electrode, the gate pad and the data pad by patterning the passivation layer and the gate insulating layer;

depositing a transparent conductive layer; and forming a pixel electrode, a first transparent electrode for the gate pad and a second transparent electrode for the data pad which are in contact with the drain electrode, the gate pad and the data pad respectively through the contact holes by patterning the transparent conductive layer.

27. A method of claim 26, wherein the second conductive layer is made of chromium.

28. A method of claim 27, wherein the transparent conductive layer is made of indium tin oxide.

29. A method of claim 28, wherein the second layer of chromium nitride and the second conductive layer is patterned using a wet etching method.

30. A method of claim 29, wherein the semiconductor layer is made of amorphous silicon.

31. A method of claim 30, further comprising the steps of:

forming a layer of doped amorphous silicon after depositing the semiconductor layer;

patterning the layer of doped amorphous silicon; and dry etching the layer of doped amorphous silicon using the data pattern as a mask after forming the data pattern.

32. A method of claim 28, wherein the first conductive layer is made of aluminum or aluminum alloy.

* * * * *